(12) United States Patent
Hoshino et al.

(10) Patent No.: US 10,712,099 B2
(45) Date of Patent: Jul. 14, 2020

(54) HEAT PIPE

(71) Applicants: KABUSHIKI KAISHA TOSHIBA, Minato-ku (JP); Toshiba Energy Systems & Solutions Corporation, Kawasaki-shi (JP)

(72) Inventors: Kunio Hoshino, Sagamihara (JP); Rei Kimura, Setagaya (JP); Yasushi Yamamoto, Yokohama (JP); Masato Fukuta, Ota (JP); Takashi Mawatari, Kawasaki (JP); Satoru Abe, Yokohama (JP)

(73) Assignees: KABUSHIKI KAISHA TOSHIBA, Minato-ku (JP); Toshiba Energy Systems & Solutions Corporation, Kawasaki-shi (JP)

( * ) Notice: Subject to any disclaimer, the term of this patent is extended or adjusted under 35 U.S.C. 154(b) by 29 days.

(21) Appl. No.: 16/028,968

(22) Filed: Jul. 6, 2018

(65) Prior Publication Data

US 2019/0011196 A1 Jan. 10, 2019

(30) Foreign Application Priority Data

Jul. 6, 2017 (JP) .................................. 2017-132780

(51) Int. Cl.
*F28D 15/02* (2006.01)
*F28D 15/06* (2006.01)
(Continued)

(52) U.S. Cl.
CPC ....... *F28D 15/0266* (2013.01); *F28D 15/025* (2013.01); *F28D 15/0233* (2013.01);
(Continued)

(58) Field of Classification Search
CPC .............. H01L 23/427; H05K 7/20336; F28D 15/0233; F28D 15/025; F28D 15/0266; F28D 15/06
See application file for complete search history.

(56) References Cited

U.S. PATENT DOCUMENTS 3,986,550 A * 10/1976 Mitsuoka ............... F28D 15/025
165/104.21
4,036,291 A * 7/1977 Kobayashi ............ H01L 23/427
165/104.21
(Continued)

FOREIGN PATENT DOCUMENTS

CN 104296568 A 1/2015
JP 56122153 A * 9/1981 ........... H01L 23/427
(Continued)

OTHER PUBLICATIONS

Office Action dated Sep. 9, 2019 in Canadian Patent Application No. 3,010,468 citing document AO therein, 4 pages.

*Primary Examiner* — Eric S Ruppert
*Assistant Examiner* — Hans R Weiland
(74) *Attorney, Agent, or Firm* — Oblon, McClelland, Maier & Neustadt, L.L.P.

(57) ABSTRACT

A heat pipe, includes; an outer tube including first and second ends, the first end closed air tight; a box connected to the second end, a cross-sectional area of the box perpendicular to the outer tube central axis is larger than a cross-sectional area of the outer tube perpendicular to its axis; an inner tube positioned in the outer tube, a central axis of the inner tube parallel to the outer tube central axis, including third and fourth ends, the third end closer to the first end than the fourth end and open in the outer tube; a partition tube including fifth and sixth ends widening from the fifth end toward the sixth end, the fifth end connected with the fourth end, part of the sixth end connected on an
(Continued)

inner surface of the box; and fluid in a space formed by the outer tube and the box.

7 Claims, 7 Drawing Sheets

(51) Int. Cl.
*H05K 7/20* (2006.01)
*H01L 23/427* (2006.01)
(52) U.S. Cl.
CPC ......... *F28D 15/06* (2013.01); *H05K 7/20336* (2013.01); *H01L 23/427* (2013.01)

(56) References Cited

U.S. PATENT DOCUMENTS

| | | | | |
|---|---|---|---|---|
| 4,061,131 A | * | 12/1977 | Bohanon | F28D 15/0266 126/590 |
| 4,355,522 A | * | 10/1982 | Gorski | F25C 1/00 165/104.11 |
| 4,921,041 A | * | 5/1990 | Akachi | F28D 15/00 165/104.14 |
| 5,036,908 A | * | 8/1991 | Petroff | F28D 15/025 165/104.19 |
| 5,203,399 A | * | 4/1993 | Koizumi | F25B 23/006 165/104.22 |
| 5,345,998 A | * | 9/1994 | Itoh | F28D 15/0208 165/104.25 |
| 6,725,910 B2 | * | 4/2004 | Ishida | B21C 37/151 165/104.21 |
| 9,182,177 B2 | * | 11/2015 | Shabany | H01L 23/427 |
| 2016/0201992 A1 | * | 7/2016 | Huang | F28D 15/025 165/104.21 |

FOREIGN PATENT DOCUMENTS

| | | | | |
|---|---|---|---|---|
| JP | 4-366391 | | 12/1992 | |
| JP | 6-229692 | | 8/1994 | |
| JP | 6-257417 | | 9/1994 | |
| JP | 7-198278 | | 8/1995 | |
| JP | 07198278 A | * | 8/1995 | ......... F28D 15/0266 |

* cited by examiner

HEAT PIPE

CROSS-REFERENCE TO RELATED APPLICATION

This application claims the benefit of priority of Japanese Patent Application No. 2017-132780, filed Jul. 6, 2017, the entire contents of which are incorporated herein by reference.

FIELD

Embodiments of the present invention relate generally to a heat pipe for transferring heat quantity from a high temperature side to a low temperature side by using a working fluid.

BACKGROUND

A heat pipe is a mechanism that can transport a large amount of heat by evaporating and condensing a working fluid sealed in an airtight container even in the case of small temperature difference. This working fluid is sealed in liquid state after evacuating the airtight container. Thus, inside the airtight container, the vapor and the liquid are present in a mixed state, the vapor being equilibrium with the saturated vapor pressure of the working fluid.

When one end of the heat pipe is heated and the other end is cooled, the vapor evaporated from the liquid in the heating section quickly flows toward the cooling section. Thereafter, the vapor having reached the cooling section condenses and returns to the liquid state, and then is refluxed toward the heating section. By the circulation of the working fluid accompanied by such a phase change, the heat quantity is transported from the heating section to the cooling section.

A wick type heat pipe, a closed two-phase thermosiphon, and a loop type heat pipe are known as representative examples of conventional heat pipes. In the wick type heat pipe, a capillary pressure is generated by a wick in which a capillary structure such as fine grooves and porous material including, e.g., a wire mesh, fiber, and sintered metal is formed, and the liquid condensed in the cooling section is refluxed to the heating section.

The closed two-phase thermosyphon condenses the vapor, which is generated in the heating section at the lower end of the container, at the cooling section at the upper end of the container so as to return the vapor into the liquid state, and refluxes this liquid to the heating section by gravity or centrifugal force. The loop type heat pipe separates the respective flow paths of the vapor and the liquid that are bidirectionally moved between the heating section and the cooling section.

[Patent Document 1] Japanese Unexamined Patent Application Publication No. 1992-366391

The closed two-phase thermosyphon is superior to the wick type heat pipe in at least the following three points. Firstly, the thermal resistance of the heating section and the cooling section is small due to the absence of the wick. Secondly, since the capillary pressure is not used to reflux the liquid, there is no limit to the maximum heat transport amount due to the capillary limit pressure. Thirdly, there is no limit to the maximum heat transport amount due to dryout in which a liquid film does not reach the heating section, dry surface appears, and the heat transfer coefficient abruptly decreases.

However, in the closed two-phase thermosyphon, the flow of vapor and the flow of liquid are opposed to each other and this causes the following problem. That is, when the flow velocity of vapor increases in the closed two-phase thermosyphon, the liquid being refluxed is blown back by the flow of the vapor and thus increase in heat transport amount is restricted. Although the above-described problem in the closed two-phase thermosyphon is solved in the case of the loop type heat pipe, the loop type heat pipe has various problems caused by complexity of routing flow piping in which the flow of vapor and the reflux of liquid are separated from each other.

In view of the above-described problems, an object of embodiments of the present invention is to provide a heat pipe that simplifies configuration of a flow path while separating the flow of the working fluid in gaseous state from the reflux of the working fluid in liquid state.

DETAILED DESCRIPTION

First Embodiment

Figure 1A:
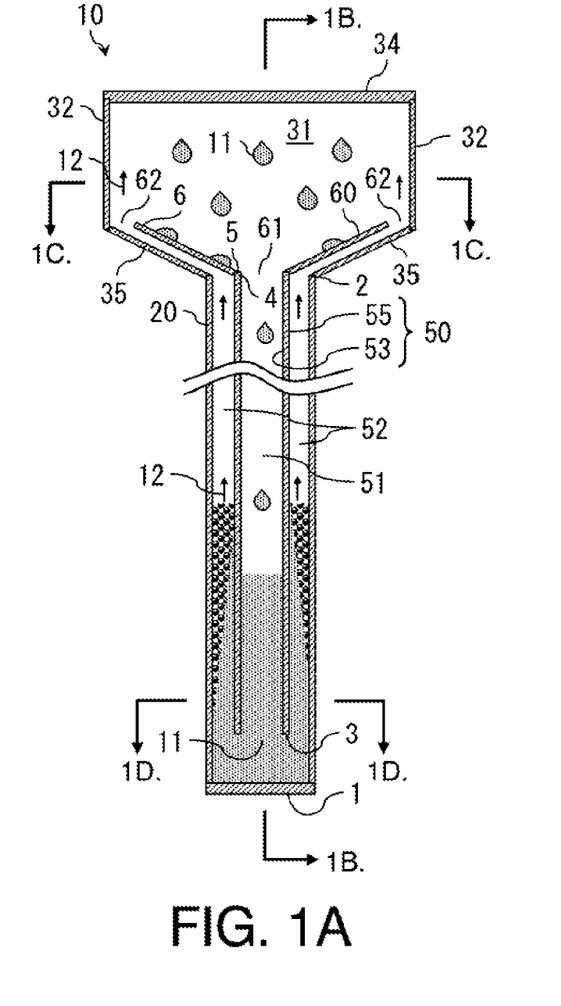
FIG. 1A to FIG. 1D are cross-sectional views of the heat pipe according to the first embodiment of the present invention.
Figure 1B:
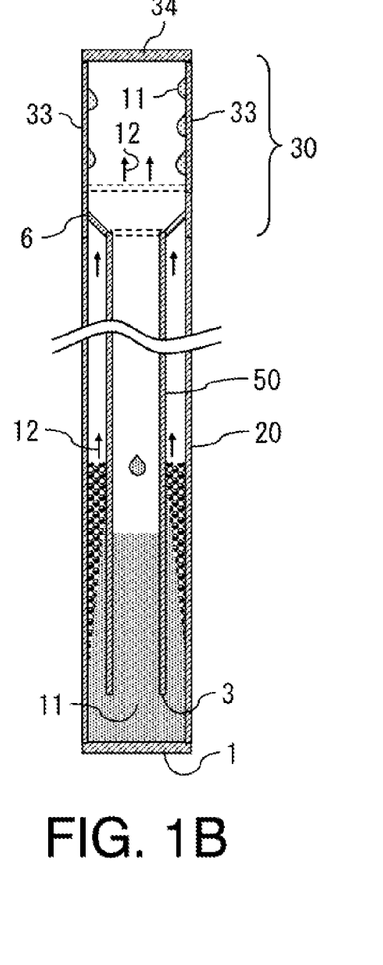
Figure 1C:
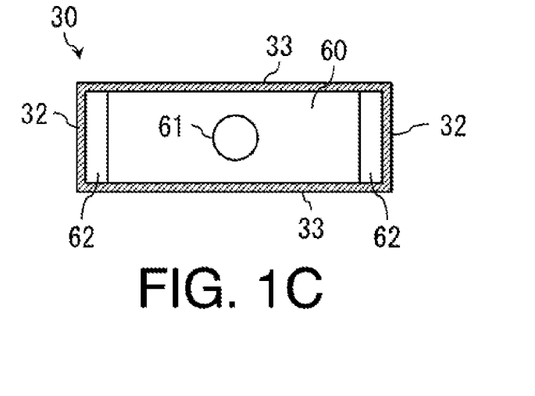
Figure 1D:
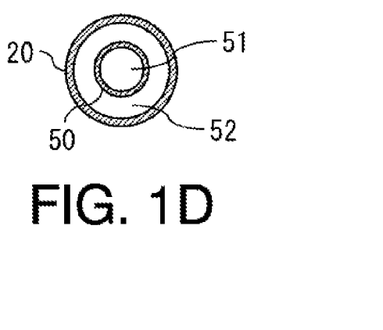

Hereinbelow, embodiments of the present invention will be described by referring to the accompanying drawings. FIG. 1A is a longitudinal cross-sectional view of a heat pipe 10 of the first embodiment. FIG. 1B is a cross-sectional view taken along the line B-B in FIG. 1A. FIG. 1C is a cross-sectional view taken along the line C-C in FIG. 1A, i.e., a horizontal cross-sectional view of a box. FIG. 1D is a cross-sectional view taken along the line D-D in FIG. 1A, i.e., a horizontal cross-sectional view of an outer tube.

As shown in FIG. 1, the heat pipe 10 of the first embodiment includes a cylindrical outer tube 20 and a box 30. Out of both ends of the outer tube 20, one end is airtightly closed and defined as the first end 1, and the other end is defined as the second end 2. The box 30 is airtightly connected to the second end 2.

An inner tube 50 and a partition tube 60 are disposed inside an airtight space formed by the outer tube 20 and the box 30, and a working fluid 11 is accommodated inside this airtight space. The central axis of the inner tube 50 is parallel to the central axis of the outer tube 20. Out of both ends of the inner tube 50, one end closer to the first end 1 is defined as the third end 3 and the other end is defined as the fourth end 4. The third end 3 opens to the inside of the outer tube 20. The partition tube 60 has a tapered cylindrical shape and tapers from the sixth end 6, which is one of both ends, toward the fifth end 5 that is the other of both ends. In other words, the partition tube 60 has a cylindrical shape in which the cross-sectional area decreases from one end toward the other end. A part of the sixth end 6 is fixed inside the box 30 and the rest of the sixth end 6 is not in contact with the inner surfaces of the box 30. The fifth end 5 is connected to the fourth end 4 of the inner tube 50.

As shown in FIG. 1A to FIG. 1D, the heat pipe 10 is installed such that the airtightly closed first end 1 of the outer tube 20 is on the lower side and the second end 2 to which the box 30 is connected is on the upper side. In the outer tube 20, the working fluid 11 in liquid state (hereinafter, referred to as the liquid working-fluid 11) absorbs heat and evaporates, and in the box 30, the same working fluid 11 in gaseous state (hereinafter, referred to as the gaseous working-fluid 12 by using a different reference sign for distinguishing it from the liquid state) dissipates heat and condenses.

The inside of the inner tube 50 is the first flow path 51. The second flow path 12 is the entirety of the space formed between the inner surfaces of the outer tube 20 and the outer surfaces of the inner tube 50 and the space sandwiched between the inner surfaces of the box 30 and the outer surface of the partition tube 60.

The connection portion between the partition tube 60 and the inner tube 50 is a portion where the first flow path 51 and the inner space of the box 30 are spatially connected with each other, and is referred to as the first opening 61.

Of the end portion of the partition tube 60, the portion that opens inside the box 30 is a portion where the second flow path 52 communicates with the inner space of the box 30, and is referred to as the second opening 62.

The partition tube 60 partitions the box 30 while having a descending slope extending from the second opening 62 toward the first opening 61.

In the outer tube 20, the bottom portion is closed such that the liquid working-fluid 11 to be accommodated does not leak out. Additionally, the outer tube 20 has a sufficiently long full-length such that its lower end (i.e., first end 1) and its upper end (i.e., second end 2) can respectively reach a non-illustrated heat source and a non-illustrated cooling source that has a large temperature difference from the heat source. The accommodated liquid working-fluid 11 absorbs heat from the non-illustrated heat source through the wall surface of the outer tube 20 and evaporates. The outer tube 20 is preferably made of a material having a high heat conductivity so that the heat exchange between the liquid working-fluid 11 and the non-illustrated heat source is promoted.

As shown in the horizontal cross-sectional view of FIG. 1C, the box 30 includes two opposing side surfaces 32, two opposing front surfaces 33, a top plate 34 for closing the upper face of the box 30, and a bottom plate 35 for closing the bottom face of the box 30. The depth dimension of each of the two opposing side surfaces 32 is set so as to substantially match the outer diameter of the outer tube 20. The width dimension of each of the two opposing front surfaces 33 is set so as to be larger than the outer diameter of the outer tube 20. The space sandwiched between the bottom plate 35 and the outer surface of the partition tube 60 forms a part of the second flow path 52. The box 30 is provided closer to the non-illustrated cooling source than the outer tube 20. The box 30 is desirably made of a material having a high thermal conductivity so that the heat exchange between the gaseous working-fluid 12 and the non-illustrated cooling source is promoted.

By configuring the box 30 in the above-described manner, its horizontal cross-sectional area becomes larger than the horizontal cross-sectional area of the outer tube 20. Further, the specific surface area (i.e., surface area per unit volume) of the box 30 can also be increased while suppressing the height dimension. By setting the specific surface area of the box 30 to a large value, the heat radiation efficiency toward the non-illustrated cooling source for the accommodated gaseous working-fluid 12 can be enhanced, and thus the reflux of the condensed liquid working-fluid 11 can be smoothed.

The gaseous working-fluid 12 having entered the inner space 31 of the box 30 from the second opening 62 releases its latent heat and condenses into the liquid working-fluid 11 by contacting the inner surfaces of the box 30. The liquid working-fluid 11 condensed on the inner surfaces of the box 30 is strongly influenced by gravity as the droplets grow, and thereby flows downward. In the present embodiment, since the aggregation rate of the working medium from gas to liquid can be increased in the box 30, the negative pressure in the internal space 31 can be increased. Consequently, it is possible to increase the moving speed of the gaseous working-fluid 12 and improve the efficiency of heat transfer from the non-illustrated heat source to the non-illustrated cooling source.

Although the top plate 34, the two opposing side surfaces 32, and the two opposing front surfaces 33 constituting the box 30 are illustrated as flat plates in the embodiment, each of these components may have a curved surface or another irregular shape in order to reduce the contact resistance with the non-illustrated cooling source. Further, by providing an external device such as an electrothermal conversion module on the surface of the box 30, the heat transported from the heat source may be effectively used.

Out of the four sides of the partition tube 60, one pair of opposing two sides are joined to the two opposing front surfaces 33 of the box 30 while the other pair of the opposing two sides form the second opening 62, i.e., the second opening 62 is formed between the other pair of the opposing two sides of the partition tube 60 and the two opposing side surfaces 32 of the box 30. The first opening 61 is provided in the center of the partition tube 60, and the partition tube 60 has a descending slope extending from the four sides toward the first opening 61.

As a result, the liquid working-fluid 11 condensed on the inner surfaces of the box 30 and flowing downward reaches the upper surface of the partition tube 60, and then is led by the downwardly inclined slope of the partition tube 60 so as to gather in the first opening 61. Since the upper end (i.e., fourth end 4) of the inner tube 50 is connected to the first opening 61 of the partition tube 60, the collected liquid working-fluid 11 further flows down along the first flow path 51 due to the action of gravity. As a result of partitioning the box 30 with the partition tube 60, a gap is formed between the lower surface of the partition tube 60 and the upper surface of the bottom plate 35 of the box 30 such that the second flow path 52 is extended and the flow path leading to the second opening 62 is secured. In other words, by bringing the partition tube 60 into contact with the inner wall of the box 30, the working fluid condensed on the inner wall of the box 30 can be efficiently led to the first path 51, and the inflow of the condensed working fluid to the second flow path 52 can be suppressed.

By providing the partition tube 60 in the above-described manner, the liquid working-fluid 11 flowing out from the box 30 to the outer tube 20 and the gaseous working-fluid 12 entering into the box 30 from the outer tube 20 do not mix with each other. In order to restrict the heat exchange between the liquid working-fluid 11 flowing down the upper surface of the partition tube 60 and the gaseous working-fluid 12 moving the lower surface thereof in the opposite direction, the partition tube 60 is desirably made of a material having a thermal conductivity lower than that of the outer tube 20 or the box 30.

The inner tube 50 is arranged coaxially with the outer tube 20 under the state where the tip opening (i.e., third end 3) of the inner tube 50 floats from the bottom surface (first end 1) of the outer tube 20. Although a description has been given of the case where the horizontal cross-section of each of the outer tube 20 and the inner tube 50 is circular, the shape of each of the outer tube 20 and the inner tube 50 is not limited to such an aspect. For instance, each of the outer tube 20 and the inner tube 50 may have a square shape or another irregular shape. The first flow path 51 formed along the inner circumferential surface 53 of the inner tube 50 is folded back at its tip opening (i.e., third end 3), and is spatially connected with the second flow path 52 formed along its outer circumferential surface 55. The liquid working-fluid 11 flowing down the first flow path 51 is accommodated at the lower end of the outer tube 20 and again repeats the cycle of absorbing heat from the heat source and evaporating as described above.

The moving direction of the descending liquid working-fluid 11 is opposite to the moving direction of the rising gaseous working-fluid 12. However, the heat pipe 10 has a double tube structure in which the inside of the outer tube 20 is partitioned by the inner tube 50. Accordingly, the liquid working-fluid 11 and the gaseous working-fluid 12 flow on the respective upper-surface and lower-surface sides of the first flow path 51, the second flow path 52, and the partition tube 60 in the state of being separated from each other. Thus, the liquid working-fluid 11 and the gaseous working-fluid 12 do not mix with each other. In order to restrict the heat exchange between the liquid working-fluid 11 flowing down the first flow path 51 and the gaseous working-fluid 12 flowing up the second flow path 52, the inner tube 50 is desirably made of a material having a thermal conductivity lower than that of the outer tube 20 or the box 30.

Since the upper end (i.e., second end 2) of the outer tube 20 is connected so as to close the opening provided in the bottom plate 35 of the box 30, the inner space 31 of the box 30 and the inner space of the outer tube 20 become an integrated closed space. Since the heat pipe 10 is configured as described above, the heat pipe 10 becomes a simple linear body as appearance and can be easily installed. Consequently, various layouts can be adopted in installation of the heat pipe 10. Although the illustrated heat pipe 10 exemplifies a linear form in which the intermediate portion is omitted, the heat pipe 10 may take a curved shape that is optimized for the positional relationship between the non-illustrated heat source and cooling source and the path connecting both.

Second Embodiment

Figure 2A:
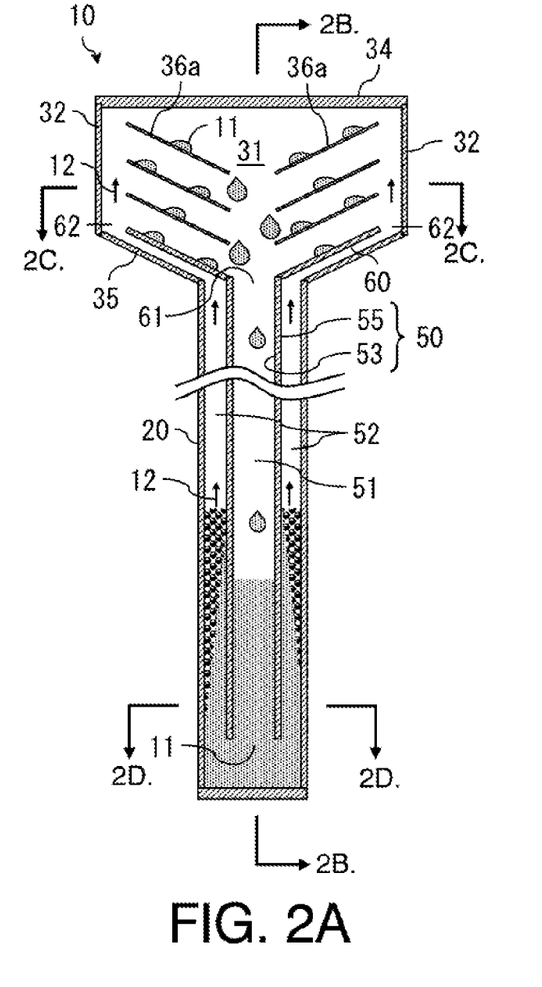
FIG. 2A to FIG. 2D are cross-sectional views of the heat pipe according to the second embodiment.
Figure 2B:
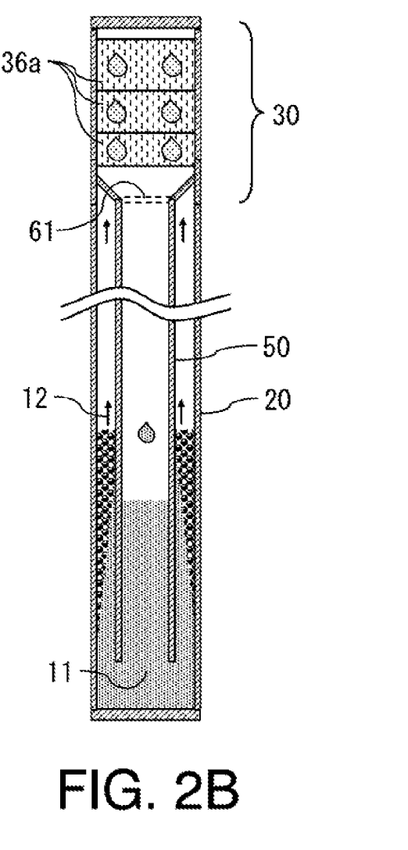
Figure 2C:
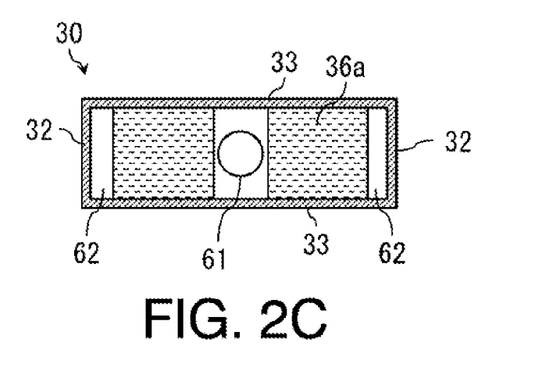
Figure 2D:
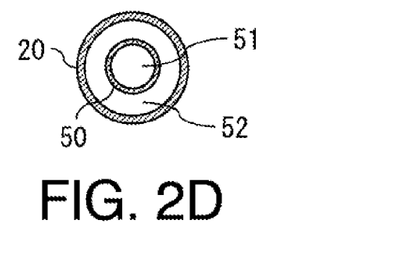

Hereinbelow, the second embodiment of the present invention will be described by referring to FIG. 2A to FIG. 2D. FIG. 2A is a longitudinal cross-sectional view of the heat pipe 10 of the second embodiment. FIG. 2B is a cross-sectional view taken along the line B-B in FIG. 2A. FIG. 2C is a cross-sectional view taken along the line C-C in FIG. 2A, i.e., a horizontal cross-sectional view of a box. FIG. 2D is a cross-sectional view taken along the line D-D in FIG. 2A, i.e., a horizontal cross-sectional view of an outer tube. In FIG. 2A to FIG. 2D, the same reference signs are assigned to the same components in terms configuration or function as the components shown in FIG. 1A to FIG. 1D, and duplicate description is omitted.

In the heat pipe 10 of the second embodiment, plural cooling plates 36a (36) are arranged in the inner space 31 of the box 30 so as to be substantially parallel to the partition tube 60. Out of the four sides of each of the cooling plates 36a as shown in FIG. 2C, one pair of opposing sides are joined to the two opposing front surfaces 33 of the box 30, one side of the other pair of opposing sides is arranged so as to be adjacent to the side surface 32 of the box 30, and the other side of the other pair of opposing sides is arranged so as to be adjacent to the first opening 61. Each of the cooling plate 36a has a descending slope extending from the side surfaces 32 of the box 30 toward the first opening 61.

The gaseous working-fluid 12 having entered the inner space 31 of the box 30 from the second opening 62 releases its latent heat and condenses into the liquid working-fluid 11 by contacting with the cooling plates 36a. The liquid working-fluid 11 condensed on the surfaces of the cooling plates 36a strongly receives the influence of gravity as the droplets grow, flows downward, and then drips into the first opening 61 so as to flow down the first flow path 51.

The cooling plates 36a are desirably made of a material having a high heat conductivity so that the heat exchange between the gaseous working-fluid 12 and the non-illustrated cooling source is promoted. In the present embodiment, by increasing the internal surface area of the box 30, it is possible to increase the aggregation rate of the working medium from gas to liquid. Further, it is also possible to prevent the aggregated liquid working-fluid 11 from entering the second opening 62 and backflowing through the second flow path 52. Consequently, it is possible to increase the moving speed of the gaseous working-fluid 12 and improve the efficiency of heat transfer from the non-illustrated heat source to the non-illustrated cooling source.

Third Embodiment

Figure 3A:
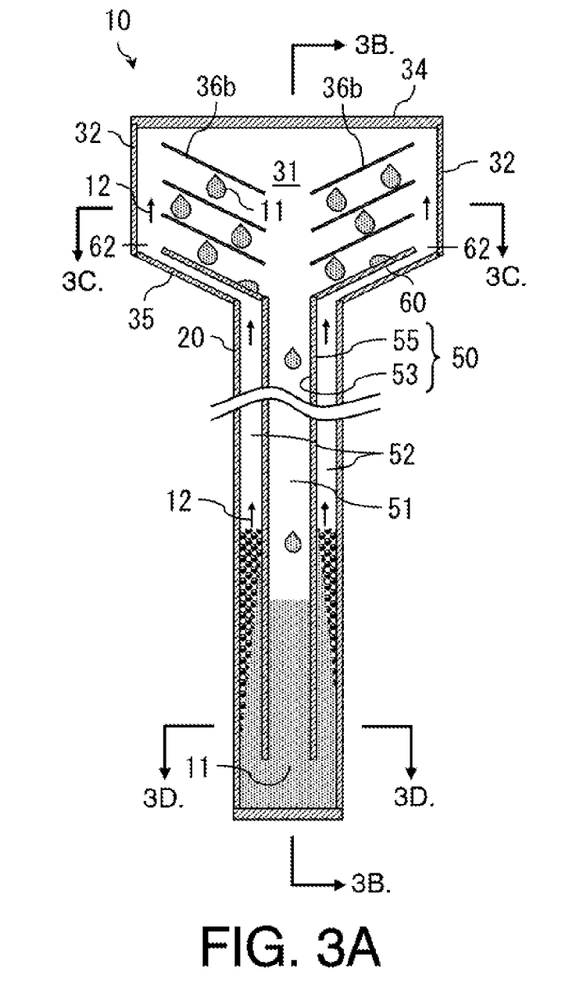
FIG. 3A to FIG. 3D are cross-sectional views of the heat pipe according to the third embodiment.
Figure 3B:
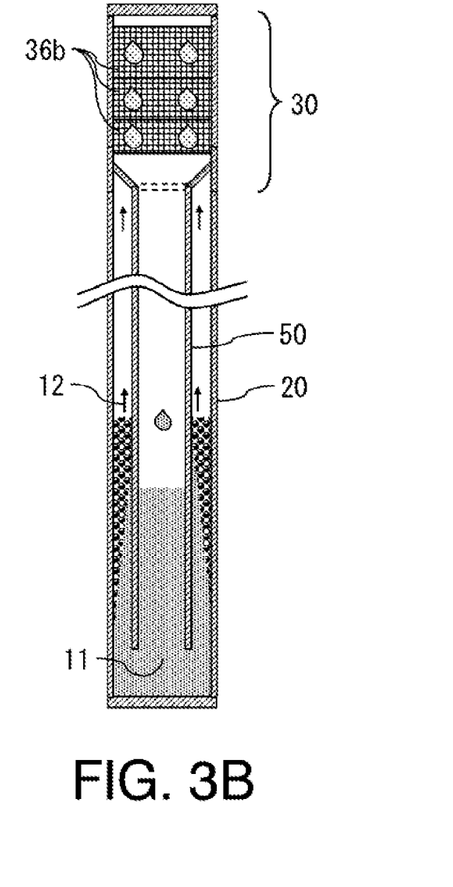
Figure 3C:
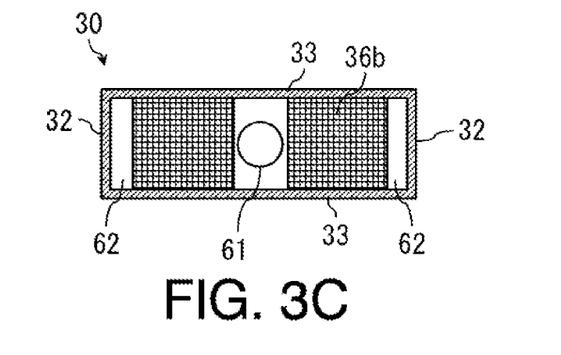
Figure 3D:
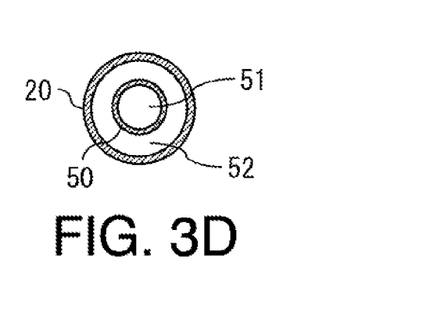

Hereinbelow, the third embodiment of the present invention will be described by referring to FIG. 3A to FIG. 3D. FIG. 3A is a longitudinal cross-sectional view of the heat pipe 10 of the third embodiment. FIG. 3B is a cross-sectional view taken along the line B-B in FIG. 3A. FIG. 3C is a cross-sectional view taken along the line C-C in FIG. 3A, i.e., a horizontal cross-sectional view of a box. FIG. 3D is a cross-sectional view taken along the line D-D in FIG. 3A, i.e., a horizontal cross-sectional view of an outer tube. In FIG. 3A to FIG. 3D, the same reference signs are assigned to the same components in terms configuration or function as the components shown in FIG. 2A to FIG. 2D, and duplicate description is omitted.

In the heat pipe 10 of the third embodiment, each of the cooling plates 36b (36) is constituted by a wire mesh. The liquid working-fluid 11 condensed on the surfaces of the cooling plates 36b strongly receives the influence of gravity as the droplets grow, and then passes through the wire mesh so as to reach the upper surface of the partition tube 60. Thereafter, the liquid working-fluid 11 flows downward along the upper surface of the partition tube 60, and then flows down from the first opening 61 to the first flow path 51.

In the present embodiment, by disposing the mesh structure inside the box 30, the rate of formation of condensation nuclei is enhanced and the aggregation rate of the working medium from gas to liquid can be increased. Consequently, it is possible to increase the moving speed of the gaseous working-fluid 12 and improve the efficiency of heat transfer from the non-illustrated heat source to the non-illustrated cooling source.

Fourth Embodiment

Figure 4A:
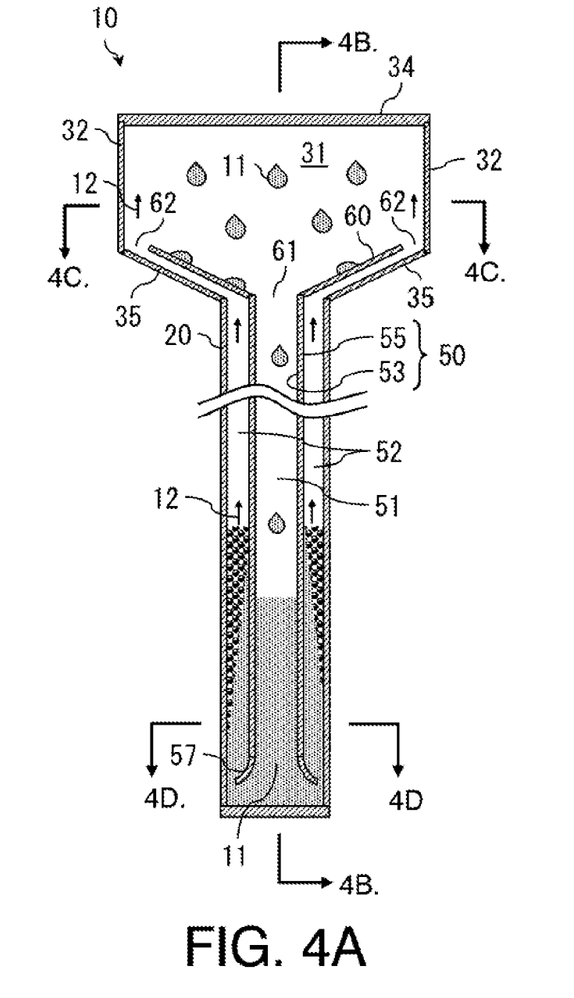
FIG. 4A to FIG. 4D are cross-sectional views of the heat pipe according to the fourth embodiment.
Figure 4B:
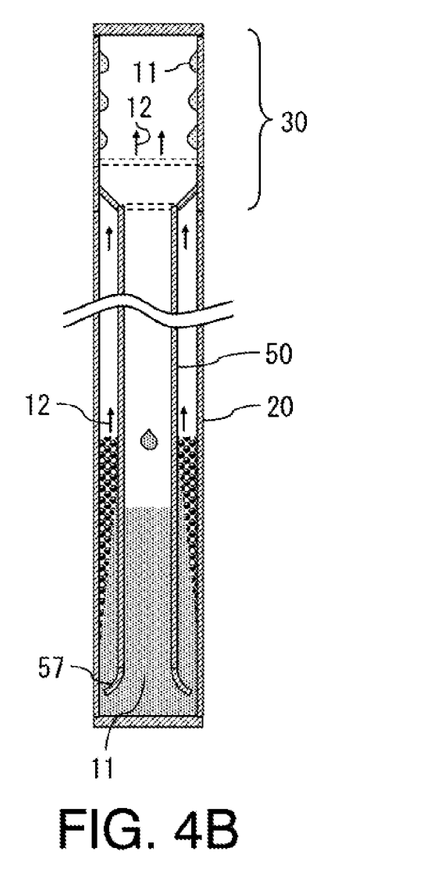
Figure 4C:
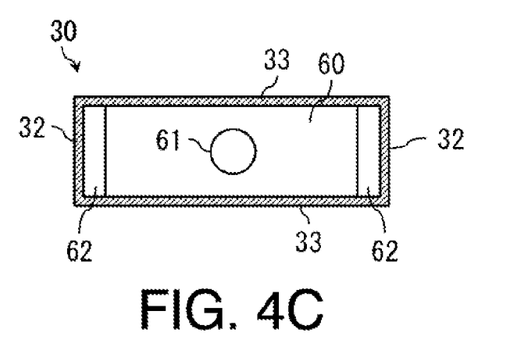
Figure 4D:
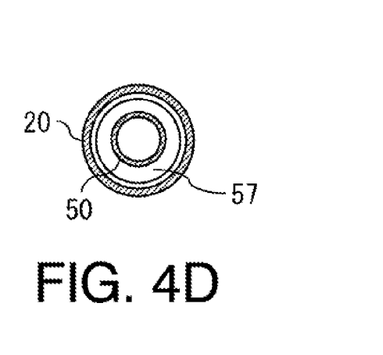

Hereinbelow, the fourth embodiment of the present invention will be described by referring to FIG. 4A to FIG. 4D. FIG. 4A is a longitudinal cross-sectional view of the heat pipe 10 of the fourth embodiment. FIG. 4B is a cross-sectional view taken along the line B-B in FIG. 4A. FIG. 4C is a cross-sectional view taken along the line C-C in FIG. 4A, i.e., a horizontal cross-sectional view of a box. FIG. 4D is a cross-sectional view taken along the line D-D in FIG. 4A, i.e., a horizontal cross-sectional view of an outer tube. In FIG. 4A to FIG. 4D, the same reference signs are assigned to the same components in terms configuration or function as the components shown in FIG. 1A to FIG. 1D, and duplicate description is omitted.

In the heat pipe 10 of the fourth embodiment, the diameter of the first flow path 51 is increased at the lower end 57 of the inner tube 50 such that the inner tube 50 forms a trumpet shape. This structure makes it possible to reduce the pressure loss at the lower portion of the outer tube 20 and to smoothly lead the liquid working-fluid 11 that returns from the first flow path 51 to the second flow path 52. Further, the gaseous working-fluid 12 generated by heating is smoothly raised to the second flow path 52 and is prevented from flowing back to the first flow path 51.

Fifth Embodiment

Figure 5A:
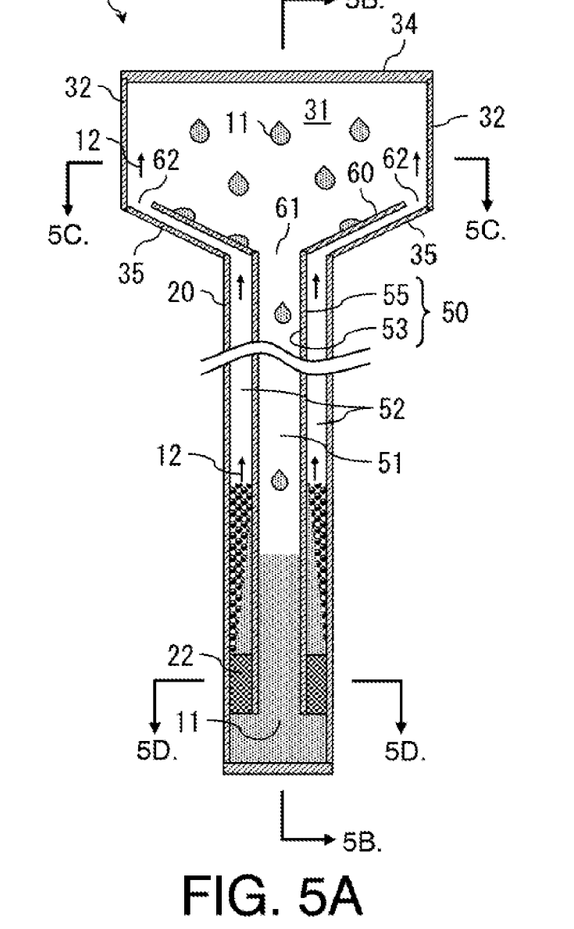
FIG. 5A to FIG. 5D are cross-sectional views of the heat pipe according to the fifth embodiment.
Figure 5B:
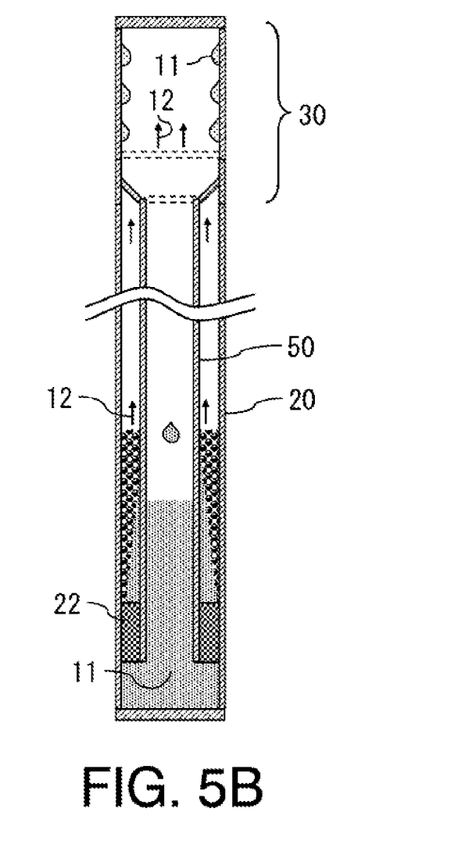
Figure 5C:
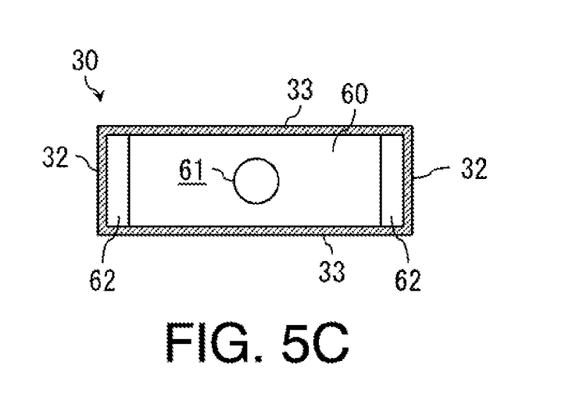
Figure 5D:
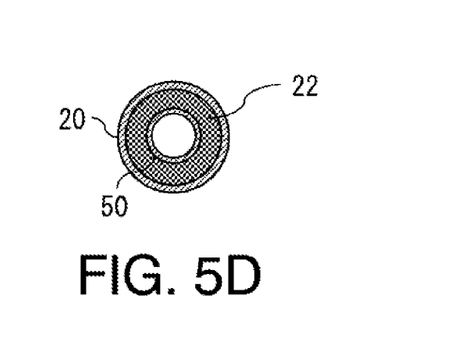

Hereinbelow, the fifth embodiment of the present invention will be described by referring to FIG. 5A to FIG. 5D. FIG. 5A is a longitudinal cross-sectional view of the heat pipe 10 of the fifth embodiment. FIG. 5B is a cross-sectional view taken along the line B-B in FIG. 5A. FIG. 5C is a cross-sectional view taken along the line C-C in FIG. 5A, i.e., a horizontal cross-sectional view of a box. FIG. 5D is a cross-sectional view taken along the line D-D in FIG. 5A, i.e., a horizontal cross-sectional view of an outer tube. In FIG. 5A to FIG. 5D, the same reference signs are assigned to the same components in terms configuration or function as the components shown in FIG. 1A to FIG. 1D, and duplicate description is omitted.

In the heat pipe 10 of the fifth embodiment, a porous material 22 is provided at the second flow path 52 at the lower end of the inner tube 50. The existence of this porous material 22 increases the contact area of the liquid working-fluid 11 accommodated at the lower end of the outer tube 20 and promotes the heat exchange with the non-illustrated heat source. In addition, the porous material 22 prevents the gaseous working-fluid 12 generated by heating from flowing back to the first flow path 51. Furthermore, the porous material 22 can improve the mechanical strength of the heat pipe 10 by supporting the tip of the inner tube 50 from the outer tube 20.

Sixth Embodiment

Figure 6A:
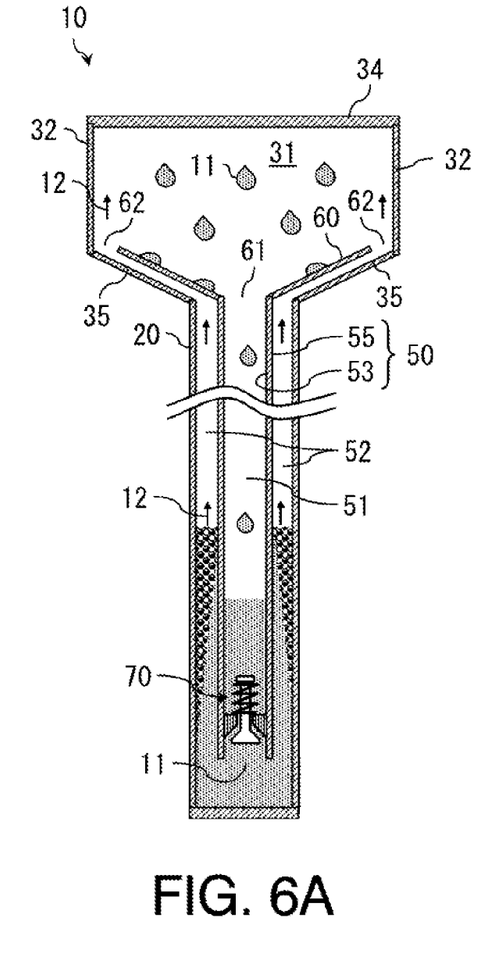
FIG. 6A to FIG. 6C are cross-sectional views of the heat pipe according to the sixth embodiment.
Figure 6B:
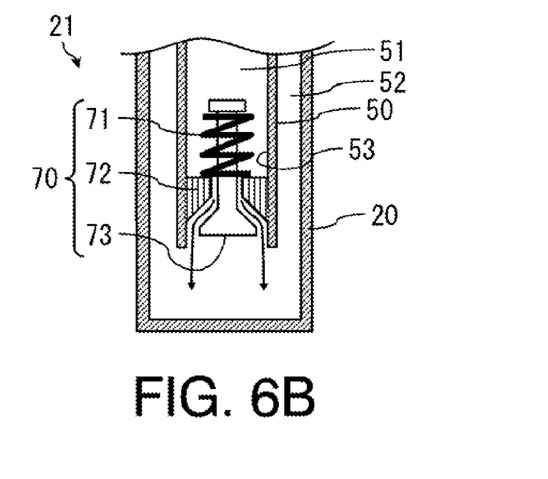
Figure 6C:
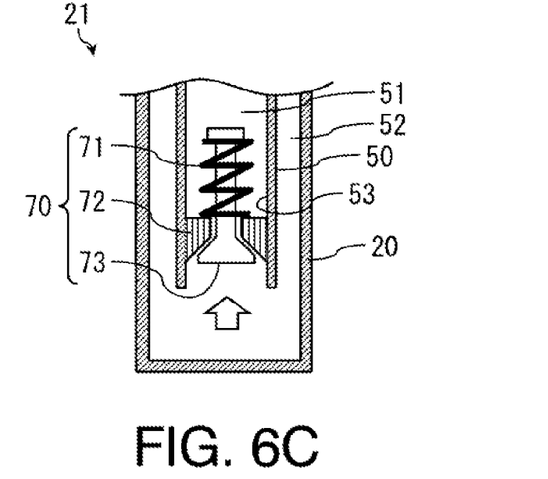

Hereinbelow, the sixth embodiment of the present invention will be described by referring to FIG. 6A to FIG. 6C. FIG. 6A is a longitudinal cross-sectional view of the heat pipe 10 of the sixth embodiment. FIG. 6B is a partially enlarged view of the tip of the heat pipe 10 at the time of normal operation. FIG. 6C is a partially enlarged view of the tip of the heat pipe 10 at the time of abnormal operation in which the internal pressure of the second flow path is increased with respect to the first flow path. In FIG. 6A to FIG. 6C, the same reference signs are assigned to the same components in terms configuration or function as the components shown in FIG. 1A to FIG. 1D, and duplicate description is omitted.

In the heat pipe 10 of the sixth embodiment, the inner tube 50 is provided with a check valve 70 that limits the flow direction of the liquid working-fluid 11 only to the forward direction from the first flow path 51 to the second flow path 52. The check valve 70 includes a support member 72 provided on the inner circumferential surface 53 of the inner tube 50, a valve body 73 that penetrates the support member 72 and is supported so as to be vertically displaceable, and an elastic member 71 that elastically connects the support member 72 to the valve body 73.

In the normal state, the liquid level of the second flow path 52 descends by evaporation, while the liquid level of the first flow path 51 rises due to reflux. Thus, in the normal state as shown in FIG. 6B, water pressure from the first flow path 51 to the second flow path 52 is applied, the gap between the support member 72 and the valve body 73 opens, and the liquid working-fluid 11 flows in the forward direction.

Conversely, when the water pressure is applied from the second flow path 52 to the first flow path 51 as shown in FIG. 6C, the gap between the support member 72 and the valve body 73 is closed and backflow of the liquid working-fluid 11 is prevented. By providing the check valve 70 in the above-described manner, the gaseous working-fluid 12 generated by heating is prevented from flowing back to the first flow path 51.

Seventh Embodiment

Figure 7A:
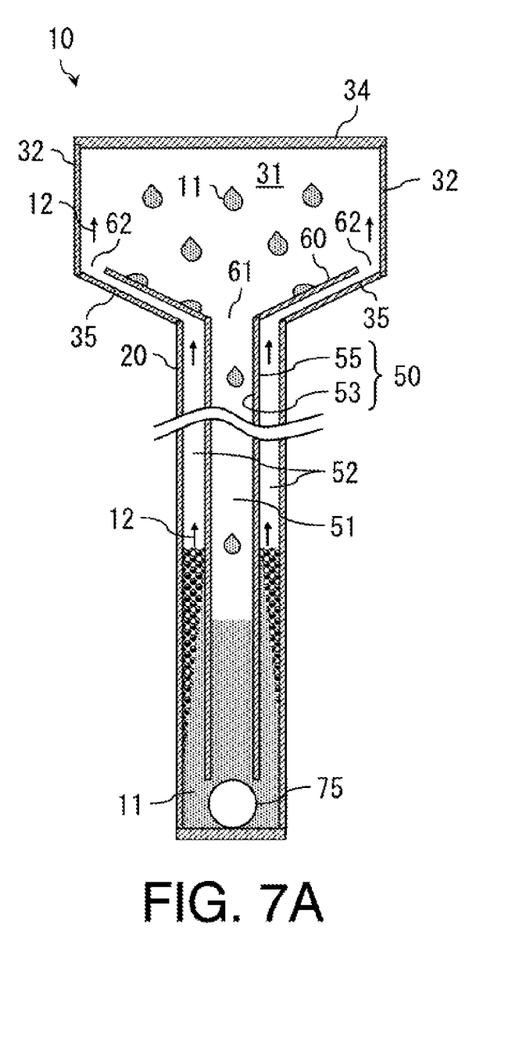
FIG. 7A to FIG. 7C are cross-sectional views of the heat pipe according to the seventh embodiment.
Figure 7B:
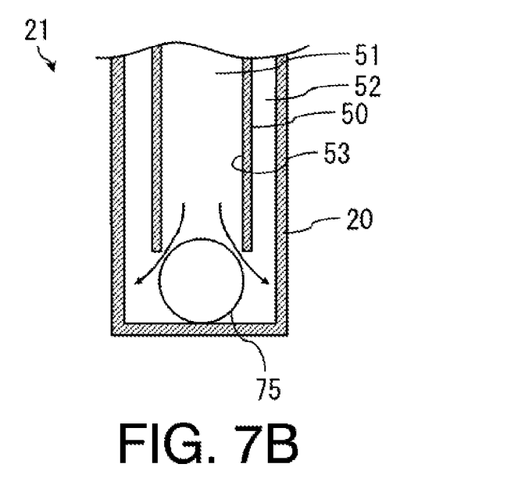
Figure 7C:
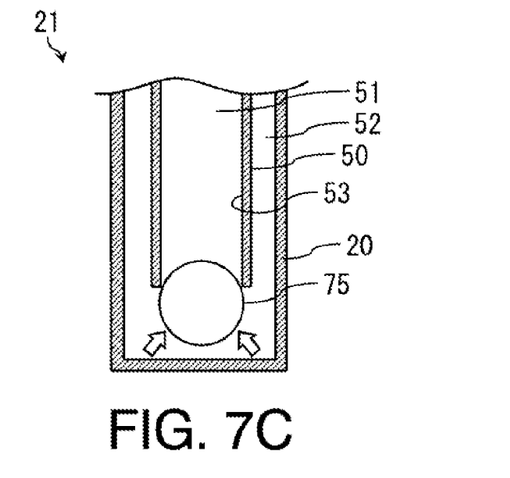

Hereinbelow, the seventh embodiment of the present invention will be described by referring to FIG. 7A to FIG. 7C. FIG. 7A is a longitudinal cross-sectional view of the heat pipe 10 of the seventh embodiment. FIG. 7B is a partially enlarged view of the tip of the heat pipe 10 at the time of normal operation. FIG. 7C is a partially enlarged view of the tip of the heat pipe 10 at the time of abnormal operation in which the internal pressure of the second flow path is increased with respect to the first flow path. In FIG. 7A to FIG. 7C, the same reference signs are assigned to the same components in terms configuration or function as the components shown in FIG. 1A to FIG. 1D, and duplicate description is omitted. In the heat pipe 10 of the seventh embodiment, the outer tube 20 is provided with a ball 75, and the ball 75 is arranged in the outer tube 20 so as to limit the flow direction of the liquid working-fluid 11 only to the forward direction from the first flow path 51 to the second flow path 52.

In the normal state, the liquid level of the second flow path 52 descends by evaporation, while the liquid level of the first flow path 51 rises due to reflux. Thus, in the normal state as shown in FIG. 7B, the water pressure from the first flow path 51 to the second flow path 52 is applied, the ball 75 is located on the bottom surface of the outer tube 20, and the gap between the tip of the inner tube 50 and the ball 75 is opened so that the liquid working-fluid 11 flows in the forward direction.

Conversely, when the water pressure is applied from the second flow path 52 to the first flow path 51 as shown in FIG. 7C, the ball 75 floats from the bottom surface of the outer tube 20 and closes the tip opening of the inner tube 50 such that the backflow of the liquid working-fluid 11 is blocked. By arranging the ball 75 in the outer tube 20 in the above-described manner, the gaseous working-fluid 12 generated by heating is prevented from flowing back to the first flow path 51.

According to the heat pipe of at least one embodiment described above, the heat pipe is constituted by the outer tube, the box, the inner tube, and the partition tube, and thus configuration of the flow path can be simplified while separating the flow of the vapor and the flow of the liquid of the working fluid from each other.

Some embodiments of the present invention have been described above. These embodiments have been presented as examples. There is no intention to limit the scope of the invention. These embodiments can also be implemented in other various modes, and variously omitted, replaced, changed, and combined without departing from the gist of the invention. The embodiments and their variations are encompassed by the scope and gist of the invention. Likewise, these embodiments and variations are encompassed by the invention described in the claims and its range of equivalence. For instance, though the check valve 70 and the ball 75 have been described as the backflow prevention structure for preventing the backflow of the working fluid 11 in the respective sixth and seventh embodiments, the backflow prevention structure is not limited to those aspects.

What is claimed is:

1. A heat pipe, comprising:
   an outer tube including a first end and a second end, the first end closed to be air tight;
   a box connected to the second end of the outer tube, a cross-sectional area of the box perpendicular to the central axis of the outer tube is larger than a cross-sectional area of the outer tube perpendicular to its axis;
   an inner tube positioned in the outer tube, a central axis of the inner tube parallel to the central axis of the outer tube, including a third end and a fourth end, the third end of the inner tube closer to the first end of the outer tube than the fourth end of the inner tube and open in the outer tube;
   a partition tube including a fifth end and a sixth end and wider from the fifth end toward the sixth end, the fifth end of the partition tube connected with the fourth end to form a first opening, a part of the sixth end connected on an inner surface of the box and the other part of the sixth end not connected on the inner surface to form a second opening; and
   a liquid working-fluid accommodated at a first end of the outer tube with the third end of the inner tube immersed, the liquid working-fluid absorbs heat and evaporates to be a gaseous working-fluid filled in a space formed by the second end of the outer tube and the box.

2. The heat pipe according to claim 1, further comprising
   a cooling plate parallel to an inner surface of the partition tube.

3. The heat pipe according to claim 2, wherein
   the cooling plate comprises a wire mesh.

4. The heat pipe according to claim 1, wherein
   the inner tube includes a part that widens toward the third end.

5. The heat pipe according to claim 1, further comprising
   a porous material in a second flow path between an inner surface of the outer tube and an outer surface of the inner tube.

6. The heat pipe according to claim 5, further comprising
   a check valve in a first flow path in the inner tube, to block a flow of the fluid from the second flow path to the first flow path.

7. The heat pipe according to claim 6, wherein
   the check valve includes a ball to close the first flow path by a buoyancy applied to the ball, the buoyancy generated by a flow of the fluid from the second flow path to the first flow path.

* * * * *